US011024596B2

(12) United States Patent
Watanabe et al.

(10) Patent No.: US 11,024,596 B2
(45) Date of Patent: Jun. 1, 2021

(54) BONDING APPARATUS AND BONDING METHOD

(71) Applicant: SHINKAWA LTD., Tokyo (JP)

(72) Inventors: Osamu Watanabe, Tokyo (JP); Tomonori Nakamura, Tokyo (JP); Toru Maeda, Tokyo (JP); Satoru Nagai, Tokyo (JP); Yuichiro Noguchi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 188 days.

(21) Appl. No.: 16/464,300

(22) PCT Filed: Nov. 29, 2017

(86) PCT No.: PCT/JP2017/042796
§ 371 (c)(1),
(2) Date: Aug. 22, 2019

(87) PCT Pub. No.: WO2018/101322
PCT Pub. Date: Jun. 7, 2018

(65) Prior Publication Data
US 2021/0005570 A1    Jan. 7, 2021

(30) Foreign Application Priority Data

Nov. 30, 2016  (JP) .............................. JP2016-233401
Mar. 6, 2017   (JP) .............................. JP2017-041466

(51) Int. Cl.
*H01L 23/00*       (2006.01)
*B29C 65/02*       (2006.01)
(Continued)

(52) U.S. Cl.
CPC .............. *H01L 24/75* (2013.01); *B29C 65/02* (2013.01); *B29C 65/1429* (2013.01);
(Continued)

(58) Field of Classification Search
CPC ....... H01L 24/75; H01L 24/81; H01L 24/743; H01L 2224/81203; H01L 8/1355;
(Continued)

(56) References Cited

U.S. PATENT DOCUMENTS 6,703,299 B2 * 3/2004 Shi ........................ H01L 21/563
257/E21.503
7,687,319 B2 * 3/2010 Nishimura .............. H01L 24/75
438/118

(Continued)

FOREIGN PATENT DOCUMENTS

| JP | 2006066625 | 3/2006 |
| JP | 2006066767 | 3/2006 |

(Continued)

OTHER PUBLICATIONS

"International Search Report (Form PCT/ISA/210) of PCT/JP2017/042796," dated Feb. 20, 2018, with English translation thereof, pp. 1-4.

*Primary Examiner* — David A Zarneke
(74) *Attorney, Agent, or Firm* — JCIPRNET (57) ABSTRACT

[Problem] To bond an electronic component on a substrate via an adhesive material satisfactorily.
[Solution] A bonding device 10 for thermally bonding an electronic component 100 to a substrate 110 or to another electronic component via an adhesive material 112, the bonding device being provided with: a bonding tool 40 comprising a bonding distal-end portion 42 which includes a bonding surface 44 and tapered side surfaces 46 formed in a tapering shape becoming narrower toward the bonding surface 44, the bonding surface 44 having a first suction hole 50 for suction-attaching the electronic component 100 via an individual piece of a porous sheet 130, the tapered side surfaces 46 having second suction holes 52, 54 for suction-attaching the porous sheet 130; and a bonding control unit 30

(Continued)

which controls the first suction hole 50 and the second suction holes 52, 54 independently from each other.

20 Claims, 8 Drawing Sheets

(51) Int. Cl.
    *B29C 65/14*           (2006.01)
    *B32B 37/02*           (2006.01)
    *H01L 21/683*         (2006.01)

(52) U.S. Cl.
    CPC .......... *B29C 65/1435* (2013.01); *B32B 37/02* (2013.01); *H01L 21/6838* (2013.01); *H01L 24/73* (2013.01); *H01L 24/83* (2013.01); *H01L 2224/73204* (2013.01); *H01L 2224/75303* (2013.01); *H01L 2224/75314* (2013.01); *H01L 2224/83203* (2013.01)

(58) Field of Classification Search
    CPC ............. H01L 8/81345; H01L 8/75301; H01L 8/75303; H01L 8/75314; H01L 8/75317; H01L 8/81001; H01L 8/81005; H01L 21/6838; H01L 21/68735; H01L 2021/60022; H01L 2021/6003; H01L 2021/6006; H01L 2021/60232; B29C 65/02; B29C 65/1429; B29C 65/1477; B29C 65/148; B29C 65/1483; B29C 65/1435; B29C 65/242
    See application file for complete search history.

(56) References Cited

U.S. PATENT DOCUMENTS

| | | | |
|---|---|---|---|
| 7,851,058 B2* | 12/2010 | Iida | B65G 49/061 428/319.3 |
| 8,163,599 B2* | 4/2012 | Tomura | H01L 21/563 438/107 |
| 8,414,999 B2* | 4/2013 | Tachibana | H01L 21/6838 428/137 |
| 8,720,519 B2 | 5/2014 | Yamakami et al. | |
| 9,659,793 B2* | 5/2017 | Heuck | H01L 21/4842 |
| 9,905,517 B2* | 2/2018 | Hiranuma | H01L 24/49 |
| 10,872,875 B2* | 12/2020 | Lee | H01L 24/73 |
| 2013/0255878 A1* | 10/2013 | Takahashi | H01L 24/75 156/288 |
| 2018/0366434 A1* | 12/2018 | McClain | H01L 24/81 |
| 2020/0032131 A1* | 1/2020 | Hassan | C09K 8/588 |

FOREIGN PATENT DOCUMENTS

| | | |
|---|---|---|
| JP | 4780858 | 9/2011 |
| JP | 2012044071 | 3/2012 |

* cited by examiner

BONDING APPARATUS AND BONDING METHOD

CROSS-REFERENCE TO RELATED APPLICATION

This application is a 371 application of the international PCT application serial no. PCT/JP2017/042796, filed on Nov. 29, 2017, which claims the priority benefit of Japan application no. 2016-233401, filed on Nov. 30, 2016, and Japan application no. 2017-041466, filed on Mar. 6, 2017. The entirety of each of the above-mentioned patent applications is hereby incorporated by reference herein and made a part of this specification.

BACKGROUND

Technical Field

The present invention relates to a bonding apparatus and a bonding method.

Description of Related Art

A mounting technology for bonding electronic components such as a semiconductor die on a substrate is known. For example, in Patent Literature 1, a resin film (adhesive) is supplied to a substrate to allow easy control of a supply amount of an adhesive, and then a semiconductor die is bonded to the substrate with the resin film therebetween using a bonding tool.

RELATED ART

Patent Literature

[Patent Literature 1]
Japanese Patent No. 4780858

SUMMARY

Technical Problem

However, conventionally, there have been cases in which an adhesive on a substrate creeps up from a side surface of the semiconductor die due to heating and pressurizing of a bonding tool, and the melted adhesive adheres to a distal end of the bonding tool. Also, when mounting is performed with a heat-melted adhesive, a fume gas generated from the adhesive may enter a suction hole of the bonding tool, thereby contaminating the bonding tool. Further, along with the recent miniaturization of electronic components, it is necessary to consider narrowing of the pitch also in a bonding process.

The present invention has been made in view of such circumstances, and it is an objective of the present invention to provide a bonding apparatus and a bonding method in which an electronic component can be satisfactorily bonded on a substrate with an adhesive material therebetween.

Solution to Problem

A bonding apparatus according to a first embodiment of the present invention is a bonding apparatus which thermo-compression bonds an electronic component to a substrate or other electronic component with an adhesive material therebetween, and the bonding apparatus includes a bonding tool having a bonding distal end portion which includes a bonding surface having a first suction hole that adsorbs the electronic component with an individual piece-like air-permeable sheet having air permeability sandwiched therebetween, and a tapered side surface formed in a tapered shape tapering toward the bonding surface and having a second suction hole that adsorbs the air-permeable sheet, and a bonding control unit which controls the first suction hole and the second suction hole independently of each other.

According to the above-described configuration, since the bonding control unit which controls the first suction hole provided on the bonding surface and the second suction hole provided on the tapered side surface independently of each other is provided, adsorption or separation of the electronic component or the air-permeable sheet can be each controlled independently as necessary. Also, since the air-permeable sheet is adsorbed by the second suction hole provided on the tapered side surface, an end portion of the individual piece-like air-permeable sheet is prevented from sagging, and the air-permeable sheet can be reliably adsorbed to the bonding distal end portion during the bonding process. Therefore, the electronic component can be satisfactorily bonded on the substrate with the adhesive material therebetween.

Advantageous Effects of Invention

According to the present invention, an electronic component can be satisfactorily bonded to a substrate with an adhesive material therebetween.

DESCRIPTION OF THE EMBODIMENTS

Hereinafter, embodiments of the present invention will be described. In the following description of the drawings, the same or similar components are denoted by the same or similar reference signs. The drawings are merely examples, dimensions and shapes of the respective parts are schematic, and the technical scope of the present invention should not be interpreted as being limited to the embodiments.

In each of the embodiments of the present invention, the term "air permeability" refers to an ability of a sheet of preventing creeping-up which is sandwiched between a bonding head and a semiconductor die to allow air to permeate therethrough to such an extent that the bonding head can hold the semiconductor die on its bonding surface due to a vacuum supplied from first and second suction holes formed in the bonding head. That is, the sheet of preventing creeping-up having air permeability may be, for example, a porous sheet, a nonwoven fabric, or a sheet in which air-permeable pores are formed to be described below, but the aspect of the present invention is not to be interpreted in a limited sense.

First Embodiment

Figure 1:
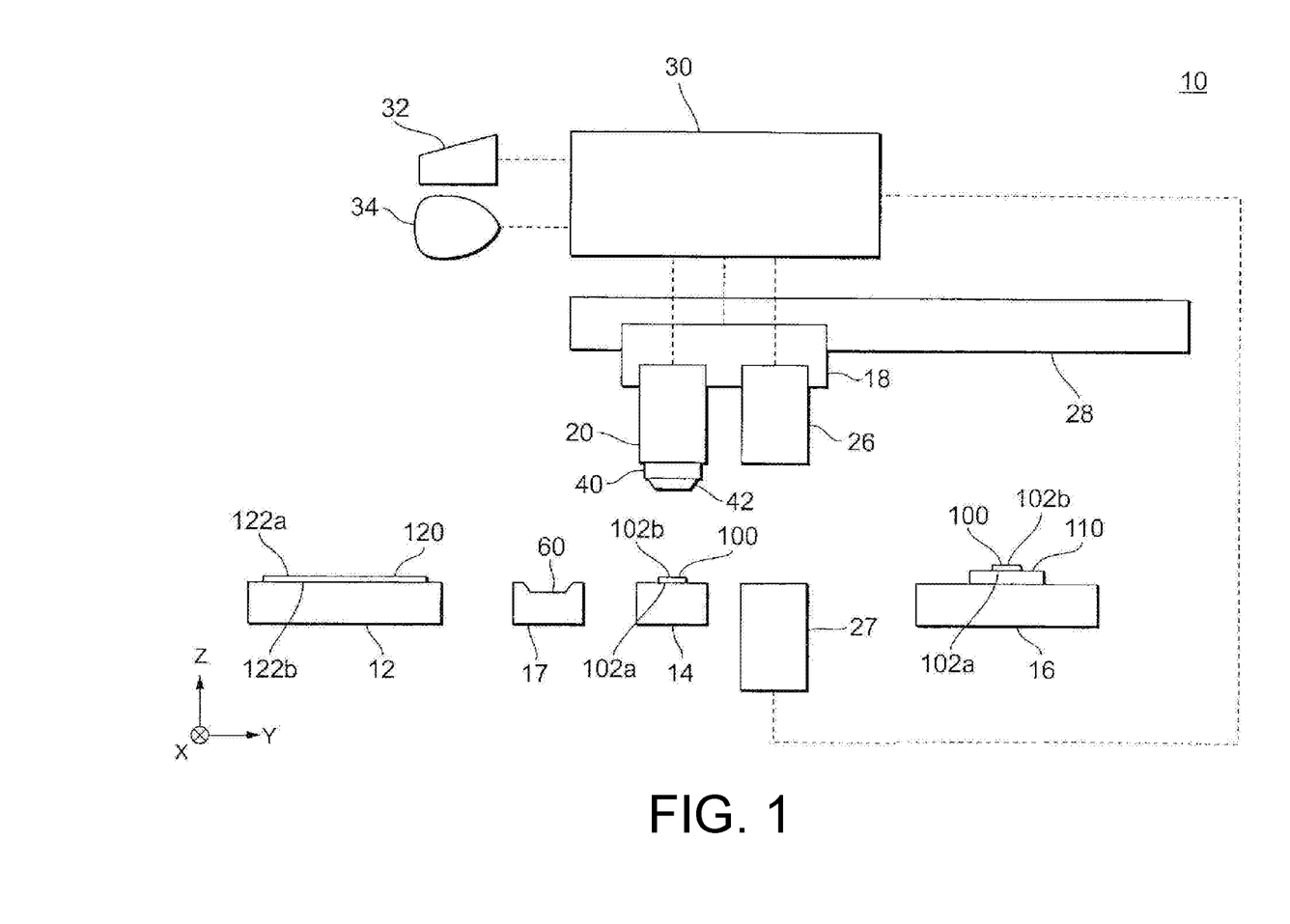
FIG. 1 is a view illustrating a bonding apparatus according to a first embodiment of the present invention.

FIG. 1 is a view schematically illustrating an entire bonding apparatus according to a first embodiment. A bonding apparatus 10 according to the present embodiment is a device for mounting a semiconductor die 100, which is an example of an electronic component, on a bonding region of a substrate 110.

In the example illustrated in FIG. 1, the semiconductor die 100 as an example of an electronic component bonded to the substrate 110 is illustrated. The semiconductor die 100 is made of a semiconductor material. The semiconductor die 100 is formed in a rectangular parallelepiped shape having a surface and a back surface which are main surfaces. Specifically, the semiconductor die 100 includes a first main surface 102a which is a surface on which a predetermined circuit pattern is formed, and a second main surface 102b which is a back surface on a side opposite to the first main surface 102a. In the present embodiment, the semiconductor die 100 is bonded to the substrate 110 such that the first main surface 102a of the semiconductor die 100 faces the substrate 110. Such a bonding mode is called face-down bonding.

The bonding apparatus 10 includes a wafer stage 12, an intermediate stage 14, a bonding stage 16, a sheet placement stage 17, a bonding head 18, a bonding tool 40 (including a bonding distal end portion 42) attached to the bonding head 18 with a Z-axis drive mechanism 20 therebetween, imaging units 26 and 27 for acquiring image information of the semiconductor die 100, an XY table 28 for moving the bonding head 18 in XY axes directions, and a bonding control unit 30 that controls operations of these components of various types.

In the following description, the XY axes directions are directions parallel to the main surface of the semiconductor die 100 (or a main surface of any one of stages), and a Z axis direction is a direction perpendicular to a surface formed by the XY axes directions. Further, the X-axis direction and the Y-axis direction are perpendicular to each other.

A wafer 120 consisting of a plurality of semiconductor dies 100 divided into individual pieces is placed on the wafer stage 12. The wafer 120 includes a first main surface 122a (corresponding to the first main surface 102a of the semiconductor die 100) which is a surface on which a predetermined circuit pattern is formed, and a second main surface 122b (corresponding to the second main surface 102b of the semiconductor die 100) which is a back surface on a side opposite to the first main surface 122a. The wafer 120 is fixed on the wafer stage 12 by affixing the second main surface 122b to a film on the wafer stage 12. The semiconductor die 100 on the wafer stage 12 is picked up by a cooperative operation of an adsorption tool and a pickup unit (none of which is illustrated) and then transferred to the intermediate stage 14 by a transfer head (not illustrated).

The intermediate stage 14 is a stage for temporarily placing the semiconductor die 100. The intermediate stage 14 is disposed between the wafer stage 12 and the bonding stage 16. When the semiconductor die 100 is bonded face-down to the substrate 110 on the bonding stage 16, an orientation of the semiconductor die 100 picked up from the wafer stage 12 is inverted, and the semiconductor die 100 is mounted on the intermediate stage 14 with an orientation in which the first main surface 102a faces the intermediate stage 14. The intermediate stage 14 is configured to be movable in the XY axes directions by a drive mechanism such as a linear motor (not illustrated). The semiconductor die 100 is fixed on the intermediate stage 14 by affixing the first main surface 102a to a film on the intermediate stage 14. The semiconductor die 100 on the intermediate stage 14 is picked up by a cooperative operation of an adsorption tool and a pickup unit (none of which is illustrated) and then transferred to the bonding stage 16 by a transfer head (not illustrated).

The bonding stage 16 is a stage on which the substrate 110 is disposed for bonding the semiconductor die 100 on the substrate 110. The substrate 110 has a mounting region on which an electronic component (semiconductor die 100) is mounted. In the example illustrated in FIG. 1, the substrate 110 has one mounting region. The substrate 110 is fixed on the bonding stage 16 by, for example, affixing a surface of the substrate 110 on a side opposite to the surface on which the mounting region is provided to a film on the bonding stage 16.

Further, as a modified example, for example, a plurality of mounting regions may be provided on one substrate 110. In this case, electronic components (semiconductor dies 100) are mounted on the respective mounting regions of the substrate 110, thereafter the substrate 110 is divided into individual pieces for each mounting region, and thereby a plurality of finished products (electronic devices having electronic components) can be obtained.

Alternatively, a stack-type semiconductor device can be manufactured by stacking a plurality of semiconductor dies 100 on one mounting region on the substrate 110. That is, on the bonding stage 16, an electronic component (semiconductor die 100) may be mounted on another electronic component (for example, semiconductor die) that has already been mounted on the substrate 110. In such a stack-type semiconductor device, all of the two or more semiconductor dies 100 mounted on the mounting region may be oriented in the same direction, or some of them may be oriented in a different direction.

A material of the substrate 110 may be made of, for example, an organic material (for example, an epoxy substrate or a polyimide substrate), an inorganic material (for example, a glass substrate), or a composite material thereof (for example, a glass epoxy substrate). The substrate 110 is a so-called interposer.

Further, the bonding stage 16 is configured to be able to move the substrate 110 in the X-axis direction using a drive mechanism such as a guide rail (not illustrated). Also, the bonding stage 16 includes a heating means for heating the substrate 110.

The sheet placement stage 17 is a stage for supplying or collecting an individual piece-like porous sheet 130 (see FIG. 4) having air permeability. The sheet placement stage 17 includes at least one sheet placement portion 60 on which the individual piece-like porous sheet 130 is placed. A configuration of the sheet placement portion 60 will be described below.

The bonding tool 40 is attached to the bonding head 18 via the Z-axis drive mechanism 20, and the imaging unit 26 is attached to the bonding head 18 at a position separated from the bonding tool 40 by a predetermined distance in the Y-axis direction. In other words, in the example illustrated in FIG. 1, the bonding tool 40 and the imaging unit 26 are fixed to the bonding head 18, and both the bonding tool 40 and the imaging unit 26 move in the XY axes directions when the bonding head 18 moves due to the XY table 28. Also, the imaging unit 27 is provided on a side opposite to the imaging unit 26. At the intermediate stage 14 or the bonding stage 16, the imaging unit 26 can image the second main surface 102b of the semiconductor die 100, and the imaging unit 27 can image the first main surface 102a of the semiconductor die 100. Further, as a modified example, the imaging unit 26 may not be fixed to the bonding head 18 and may be movable separately from the bonding tool 40.

The bonding tool 40 includes the bonding distal end portion 42 for bonding the semiconductor die 100. The bonding distal end portion 42 is an end portion on the bonding stage 16 side of the bonding tool 40 extending in the Z-axis direction. The bonding tool 40 incorporates a heater (not illustrated) so that the semiconductor die 100 or the substrate 110 can be heated. Also, the bonding tool 40 has an air vacuum function and/or an air blow function so that the semiconductor die 100 or the porous sheet 130 can be adsorbed and separated. In the present embodiment, the semiconductor die 100 is bonded to the substrate 110 with the porous sheet 130 sandwiched therebetween by the bonding tool 40. Further, a configuration of the bonding tool 40 will be described below.

The porous sheet 130 has a plurality of pores so that it is permeable to air between one main surface and the other main surface. A Gurley value of the porous sheet 130 is preferably small in order to adsorb an electronic component such as the semiconductor die 100 and is preferably, for example, in a range of 1 to 2 (s/100 cc/in$^2$).

Also, the porous sheet 130 is made of a material softer than a semiconductor material of the semiconductor die 100 or a material of a bonding surface 44 to be bonded. The porous sheet 130 may be, for example, a nonwoven fabric.

The porous sheet 130 may be, for example, a polytetrafluoroethylene (PTFE) resin or polyimide, but the material is not limited thereto, and other porous materials may also be used. For example, when a polytetrafluoroethylene resin is used for the porous sheet 130, the polytetrafluoroethylene resin may be PTFE nanofibers. PTFE nanofibers having a pore diameter of about 1 to 2 μm, a thickness of about 56 μm, and a Gurley value of 1.2 (s/100 cc/in$^2$) may be used. PTFE nanofibers can be made to have a small Gurley value (that is, improved air permeability) despite being thick, and have heat resistance in a manufacturing process in which heating to, for example, 230° C. or higher is applied because there is almost no heat shrinkage even when they are heated to about 260° C. Therefore, it is effective when PTFE nanofibers be used for the porous sheet 130 of the present embodiment.

The bonding control unit 30 controls necessary processing for bonding by the bonding apparatus 10. The bonding control unit 30 performs position control of the bonding tool 40 including XYZ axis driving, θ axis driving (rotation around the Z axis), and tilt driving (inclination direction) of the bonding tool 40, ON or OFF control of an air vacuum function and/or an air blow function, load control when the semiconductor die 100 is mounted on substrate 110, heat supply control of the bonding tool 40 or the bonding stage 16, and the like. The bonding control unit 30 is connected to be able to transmit and receive signals to and from each component such as the bonding head 18, the bonding tool 40, the imaging units 26 and 27, or the like, and thereby control these operations.

An operation unit 32 for inputting control information and a display unit 34 for outputting control information are connected to the bonding control unit 30. Thereby, it is configured such that an operator can input necessary control information using the operation unit 32 while viewing a screen on the display unit 34.

The bonding control unit 30 is a computer device including a central processing unit (CPU), a memory, and the like, and a bonding program and the like for performing processing required for bonding are stored in the memory in advance. The bonding control unit 30 is configured to be able to execute each process related to a method of mounting a semiconductor die according to the present embodiment to be described below (for example, a program for causing a computer to execute each operation is provided).

Figure 2:
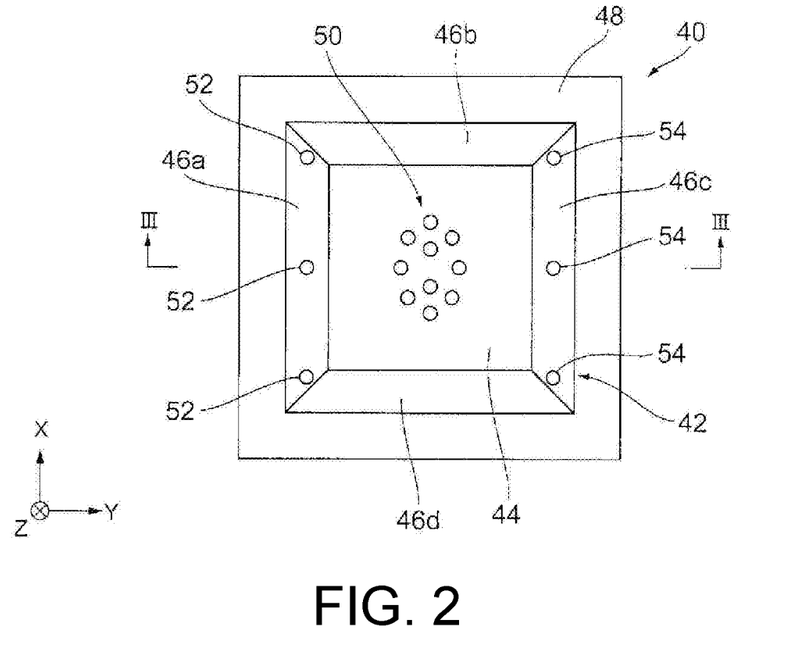
FIG. 2 is a plan view of a bonding tool of FIG. 1.
Figure 3:
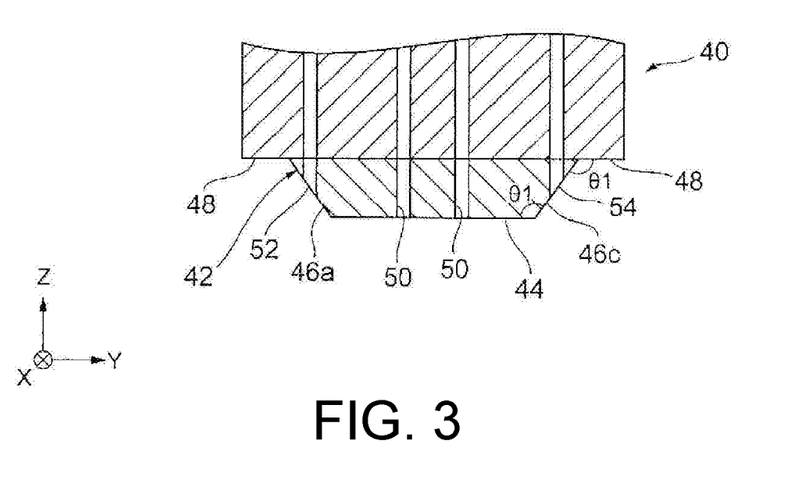
FIG. 3 is a cross-sectional view taken along line III-III of FIG. 2.

Next, details of the bonding tool 40 according to the present embodiment will be described with reference to FIGS. 2 and 3. FIG. 2 is a plan view of the bonding tool 40. FIG. 3 is a cross-sectional view taken along line III-III of FIG. 2.

The bonding distal end portion 42 includes the bonding surface 44 and tapered side surfaces 46a to 46d (hereinafter these are collectively referred to as "tapered side surface 46") tapered toward the bonding surface 44. In the example illustrated in FIG. 2, a plurality of first suction holes 50 are provided on the bonding surface 44 and a plurality of second suction holes 52 and 54 are provided on the tapered side surface 46 so that the porous sheet 130 or the semiconductor die 100 can be adsorbed or separated.

The bonding surface 44 corresponds to a shape of the semiconductor die 100 to be bonded, and has, for example, a rectangular shape in an XY plan view. Also, the bonding surface 44 has a shape larger than that of the semiconductor die 100 (electronic component) in the XY plan view. According to this, since the whole of the semiconductor die 100 can be uniformly pressed by the bonding surface 44, satisfactory bonding can be realized.

The tapered side surface 46 is provided on each side of the bonding surface 44. In the example illustrated in FIG. 2, the tapered side surface 46a is provided on any one of the sides of the bonding surface 44, the tapered side surface 46b is provided adjacent to the tapered side surface 46a, the tapered side surface 46c is provided adjacent to the tapered side surface 46b, and the tapered side surface 46d is provided adjacent to the tapered side surface 46c. In other words, the tapered side surfaces 46a and 46c are provided on respective sides of the bonding surface 44 facing each other, while the tapered side surfaces 46b and 46d are provided on respective sides of the bonding surface 44 facing each other. As illustrated in FIG. 3, an angle θ1 formed by each of the tapered side surfaces 46a to 46d and a peripheral surface 48 (or the bonding surface 44) of the bonding tool 40 is θ1>90 degrees (for example, θ1≥135 degrees). The inclination angle θ1 of each of the tapered side surfaces 46a to 46d can be appropriately set in accordance with a size of the bonding surface 44, a degree of adsorption of the semiconductor die 100, or the like.

The plurality of first suction holes 50 (10 in FIG. 2) are provided in a central region of the bonding surface 44.

Thereby, the semiconductor die 100 can be effectively adsorbed by the first suction holes 50.

Further, the plurality of first suction holes 50 extend toward a base end portion side of the bonding tool 40 and communicate with each other (not illustrated). Thereby, the plurality of first suction holes 50 can be collectively controlled.

Also, the plurality of second suction holes 52 (three in FIG. 2) are provided on the tapered side surface 46a which is one of the tapered side surfaces, and the plurality of second suction holes 54 (three in FIG. 2) are provided on the tapered side surface 46c facing the tapered side surface 46a. On the other hand, the second suction holes are not provided on the remaining tapered side surfaces 46b and 46d. According to this, since the porous sheet 130 is adsorbed and supported in one direction, wrinkling and sagging of the sheet can be suppressed, and thereby the porous sheet 130 can be adsorbed to the bonding distal end portion 42 in a satisfactory state.

In the example illustrated in FIG. 2, the second suction holes 52 (or the second suction holes 54) are disposed such that intervals therebetween are substantially uniform in a direction in which the side of the bonding surface 44 extends on the tapered side surface 46a (or the tapered side surface 46c).

Further, the plurality of second suction holes 52 and 54 extend toward the base end portion side of the bonding tool 40 and communicate with each other (not illustrated). Thereby, the plurality of second suction holes 52 and 54 can be collectively controlled.

In the present embodiment, the plurality of first suction holes 50 provided on the bonding surface 44 and the plurality of second suction holes 52 and 54 provided on the tapered side surface 46 are configured to be controllable independently of each other. When such a configuration is employed, for example, (i) when both the porous sheet 130 and the semiconductor die 100 are adsorbed to the bonding tool 40, all suction operations of the first suction holes 50 and the second suction holes 52 and 54 are controlled such that they are in ON states, (ii) when the semiconductor die 100 is separated from the bonding tool 40, the suction operations of the second suction holes 52 and 54 are controlled such that they are in ON states while the suction operation of the first suction holes 50 is controlled such that it is in an OFF state, (iii) when the porous sheet 130 is separated from the bonding tool 40, all the suction operations of the first suction holes 50 and the second suction holes 52 and 54 are controlled such that they are in OFF states.

Further, in the above-described (i) to (iii), instead of causing the suction operation to be in the OFF state, an exhaust operation may be controlled such that it is in an ON state to cause vacuum breakage by air blowing or the like. According to this, the semiconductor die 100 or the porous sheet 130 can be reliably separated from the bonding tool 40.

Figure 4:
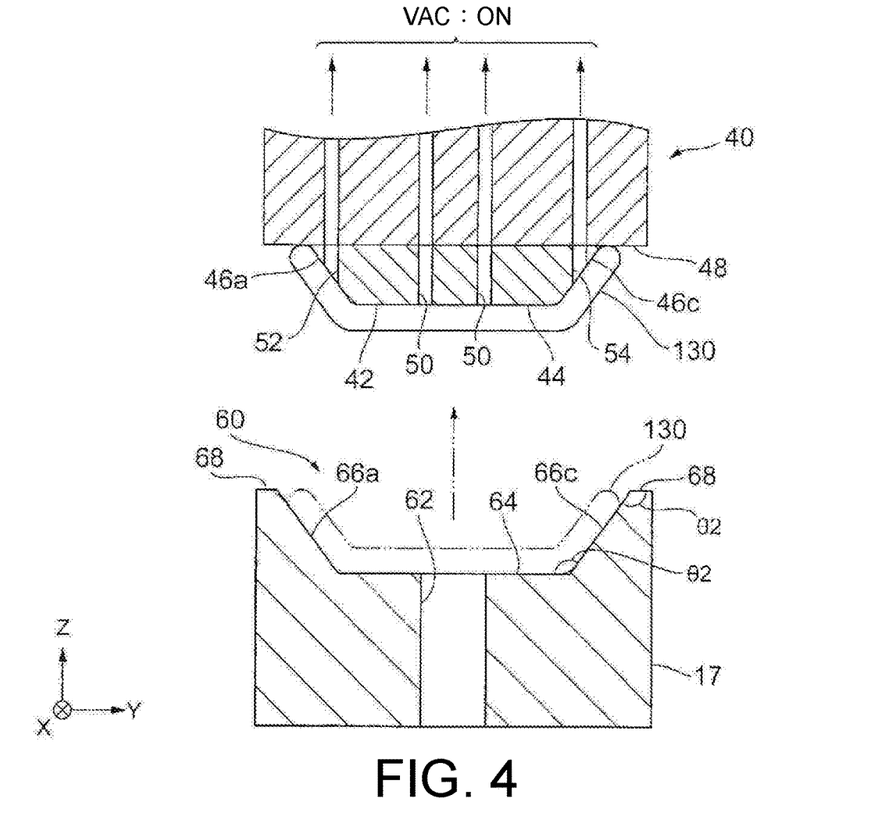
FIG. 4 is a view illustrating a bonding method according to the present embodiment.
Figure 5:
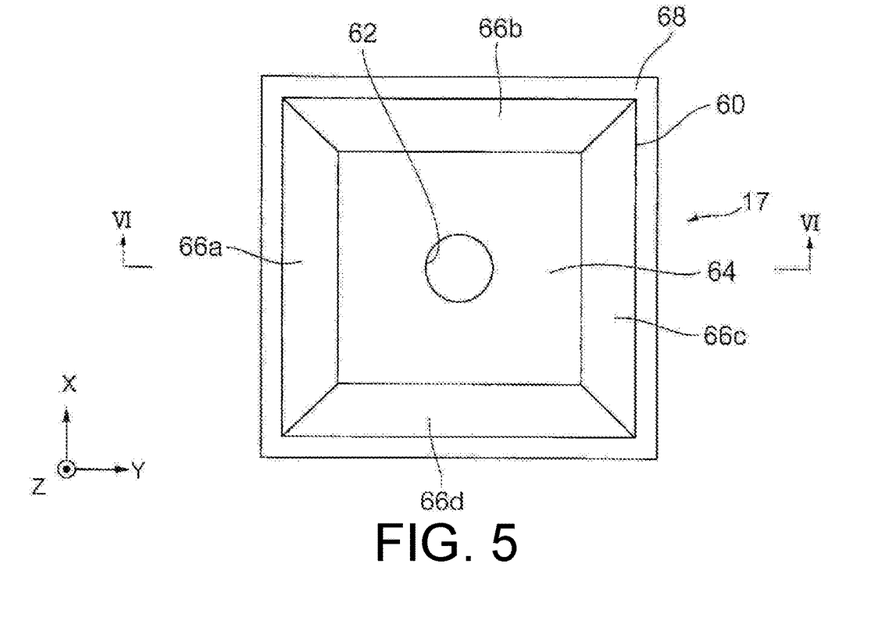
FIG. 5 is a plan view of a sheet placement stage of FIG. 4.
Figure 8:
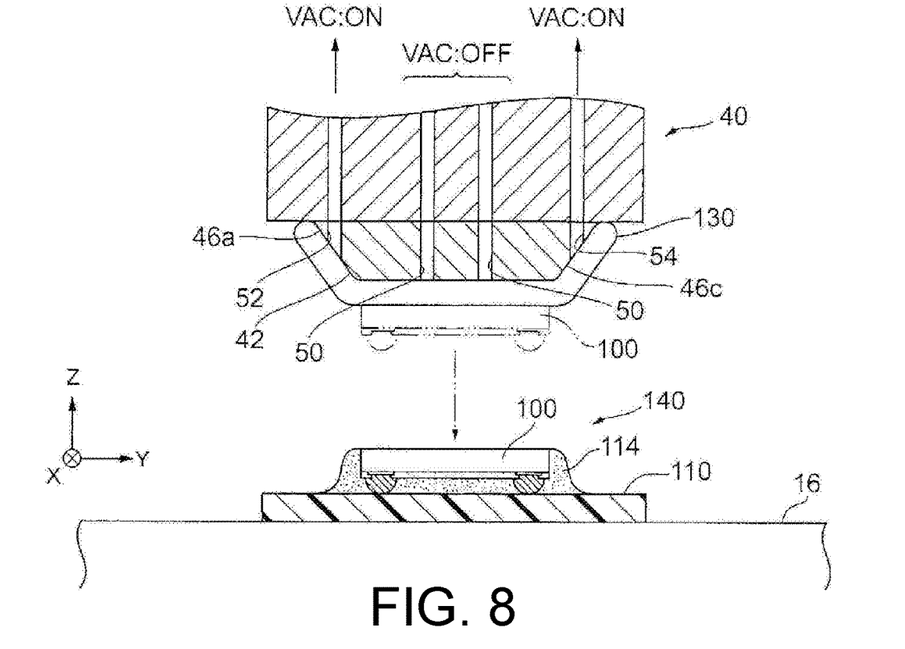
FIG. 8 is a view illustrating the bonding method according to the first embodiment.
Figure 9:
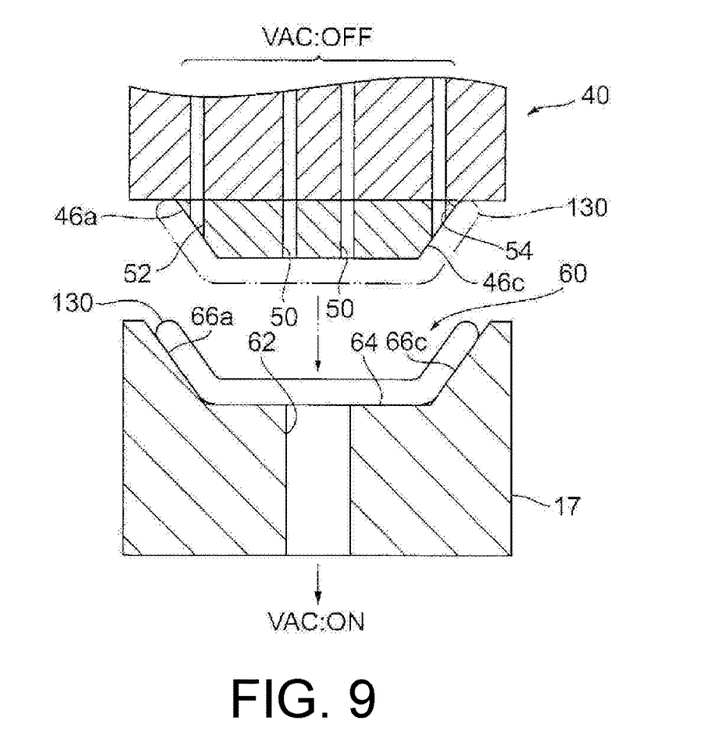
FIG. 9 is a view illustrating the bonding method according to the first embodiment.
Figure 10:
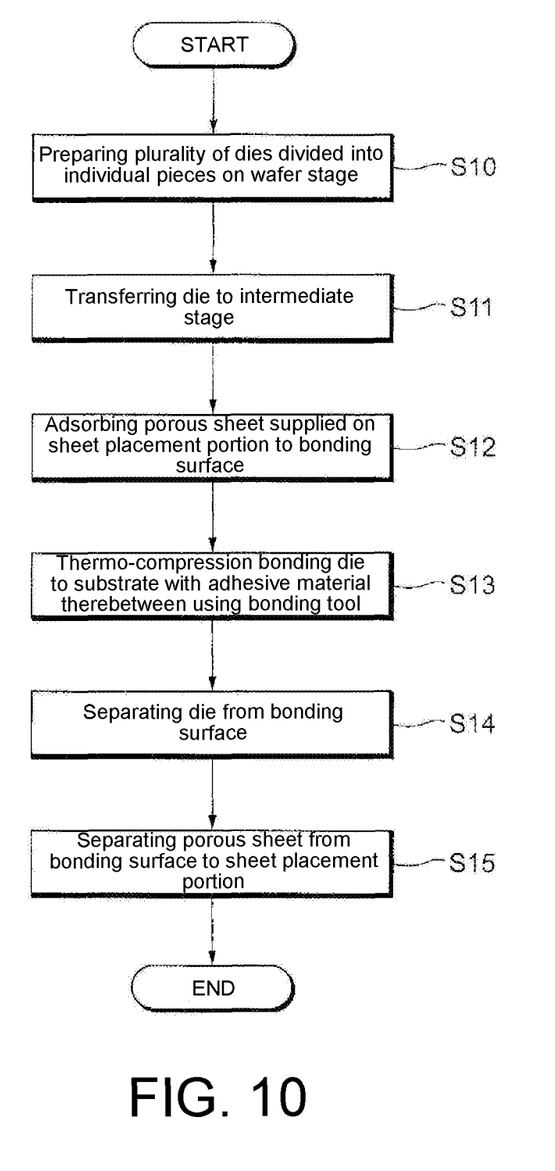
FIG. 10 is a flowchart of the bonding method according to the first embodiment.

Next, a bonding method according to the present embodiment will be described with reference to FIGS. 4 to 10. FIGS. 4 to 9 are views illustrating the bonding method according to the present embodiment, and FIG. 10 is a flowchart of the bonding method according to the present embodiment. Further, FIG. 5 is a plan view of the sheet placement stage according to the present embodiment. The bonding method according to the present embodiment can be performed by the bonding apparatus 10 illustrated in FIG. 1. A semiconductor device (see FIG. 8) in which the semiconductor die 100 is mounted on the substrate 110 with an adhesive material 114 therebetween can be manufactured by the bonding method of the present embodiment.

Hereinafter, the bonding method will be described according to the flowchart of FIG. 10 while referring to each of FIGS. 4 to 9.

First, a plurality of semiconductor dies 100 divided into individual pieces are prepared on the wafer stage 12 (S10). Specifically, the wafer 120 consisting of a plurality of semiconductor dies 100 affixed to a film is prepared on the wafer stage 12 as illustrated in FIG. 1. The wafer 120 is disposed on the wafer stage 12 such that each of the plurality of semiconductor dies 100 has the first main surface 102a facing upward and the second main surface 102b facing the wafer stage 12.

Next, the semiconductor die 100 is transferred to the intermediate stage 14 (S11). For example, the plurality of semiconductor dies 100 on the wafer stage 12 may be transferred to the intermediate stage 14 one at a time by a cooperative operation of the suction tool and the pickup unit (none of which is illustrated).

On the other hand, the porous sheet 130 is supplied to the sheet placement portion 60 of the sheet placement stage 17, the bonding tool 40 is moved above the sheet placement stage 17, and the porous sheet 130 is adsorbed to the bonding surface 44 (S12). Specifically, as illustrated in FIG. 4, the bonding distal end portion 42 is fitted to the sheet placement portion 60, and the porous sheet 130 is adsorbed to the bonding distal end portion 42 by causing the suction operations of the first suction holes 50 and the second suction holes 52 and 54 to be in ON states (VAC: ON). Step S12 can be performed in parallel with step S11 or after step S11.

Here, a configuration of the sheet placement stage 17 will be described. FIG. 5 is a plan view of the sheet placement stage 17, and FIG. 4 is a cross-sectional view taken along line VI-VI of FIG. 5.

The sheet placement stage 17 includes at least one sheet placement portion 60. One individual piece-like porous sheet 130 is placed on one sheet placement portion 60. Although one sheet placement portion 60 is illustrated in the example illustrated in FIG. 4, a plurality of sheet placement portions 60 may be provided on the sheet placement stage 17.

The sheet placement portion 60 includes a bottom surface 64 which supports the porous sheet 130, and tapered side surfaces 66a, 66b, 66c, and 66d formed in a tapered shape which widens with distance away from the bottom surface 64 (hereinafter these are collectively referred to as "tapered side surface 66"). In the example illustrated in FIG. 4, a sheet collection hole 62 for collecting the porous sheet 130 is provided on the bottom surface 64.

The bottom surface 64 corresponds to the shape of the bonding surface 44 and has, for example, a rectangular shape in the XY plan view. Also, the bottom surface 64 has a shape larger than that of the semiconductor die 100 (electronic component) in the XY plan view.

The tapered side surface 66 is provided corresponding to the tapered side surface 46 of the bonding distal end portion 42 and is provided on each side of the bottom surface 64. In the example illustrated in FIG. 5, the tapered side surface 66a is provided on any one of the sides of the bottom surface 64, the tapered side surface 66b is provided adjacent to the tapered side surface 66a, the tapered side surface 66c is provided adjacent to the tapered side surface 66b, and the tapered side surface 66d is provided adjacent to the tapered side surface 66c. In other words, the tapered side surfaces 66a and 66c are provided on respective sides of the bottom surface 64 facing each other, while the tapered side surfaces 66b and 66d are provided on respective sides of the bottom surface 64 facing each other. As illustrated in FIG. 4, an angle θ2 formed by each of the tapered side surfaces 66a to 66d and a periphery 68 (or the bottom surface 64) of the sheet placement stage 17 is θ2 >90 degrees (for example, θ2 ≥135 degrees). The inclination angle θ2 of each of the tapered side surfaces 66a to 66d may be substantially the same as the inclination angle θ1 of each of the tapered side surfaces 46a to 46d of the bonding distal end portion 42.

Referring to the flowchart of FIG. 10 again, next, the semiconductor die 100 is thermo-compression bonded to the substrate 110 with an adhesive material 112 therebetween using the bonding tool 40 (S13).

Figure 6:
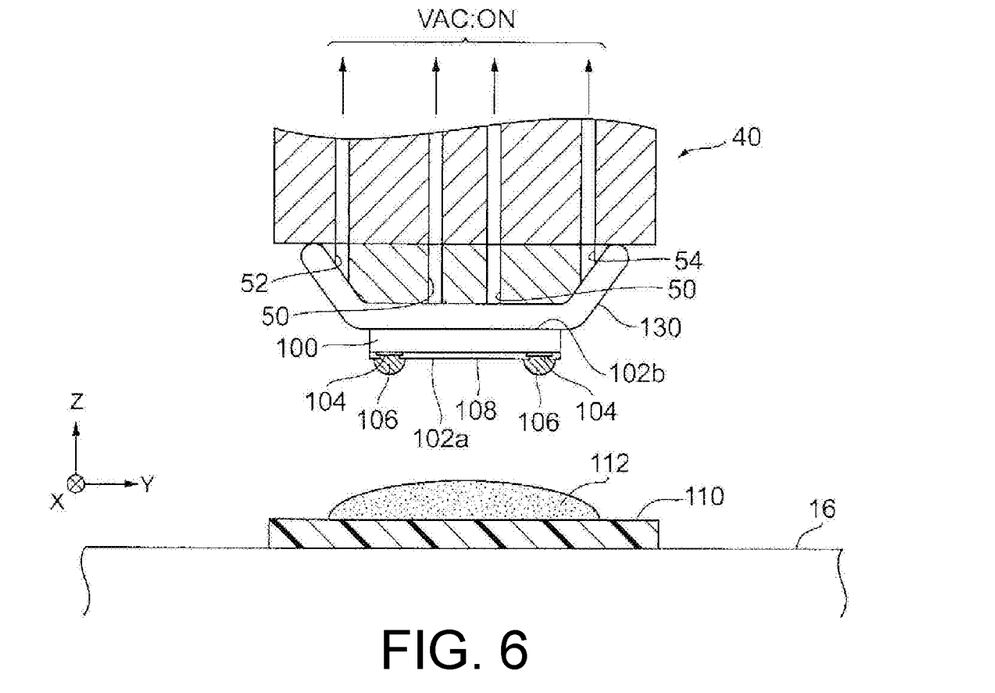
FIG. 6 is a view illustrating the bonding method according to the first embodiment.

Specifically, first, in a state in which the porous sheet 130 is adsorbed to the bonding distal end portion 42, the bonding tool 40 is moved above the intermediate stage 14, and the semiconductor die 100 on the intermediate stage 14 is adsorbed to the bonding distal end portion 42 with the porous sheet 130 sandwiched therebetween. Thereafter, the bonding tool 40 is disposed above the bonding stage 16 as illustrated in FIG. 6. In this case, in the semiconductor die 100, the first main surface 102a on which a predetermined circuit pattern is formed faces the substrate 110, and the second main surface 102b is adsorbed to the bonding surface 44 with the porous sheet 130 sandwiched therebetween. Also, the porous sheet 130 is adsorbed to the bonding surface 44 and the tapered side surface 46. As illustrated in FIG. 6, during the process of step S13, the suction operations of the first suction holes 50 and the second suction holes 52 and 54 are caused to be in ON state (VAC: ON).

Here, a configuration of the semiconductor die 100 will be described. A plurality of electrode pads 104, a plurality of bump electrodes 106 provided on the plurality of electrode pads 104, and a protective film 108 provided around the plurality of bump electrodes 106 are provided on the first main surface 102a of the semiconductor die 100. The electrode pads 104 are terminals electrically connected to the circuit pattern formed on the first main surface 102a. Also, an outer circumferential end portion of each of the electrode pads 104 is covered with the protective film 108, and a central portion of the electrode pad 104 exposed thereby is a connection part with the bump electrode 106.

Although materials of the electrode pad 104 and the bump electrode 106 are not limited, for example, the electrode pad 104 may be aluminum, copper, or the like, and the bump electrode 106 may be gold or the like.

Referring to FIG. 6 again, the substrate 110 is disposed on the bonding stage 16, and the adhesive material 112 is provided in a region of the substrate 110 on which the semiconductor die 100 is mounted. In the example illustrated in FIG. 6, although the adhesive material 112 is in a form of a paste at room temperature, the present invention is not limited thereto and it may be in a form of a film at room temperature. The adhesive material 112 may be, for example, a thermosetting resin. According to this, the adhesive material 112 can be melted and cured by heating.

Figure 7:
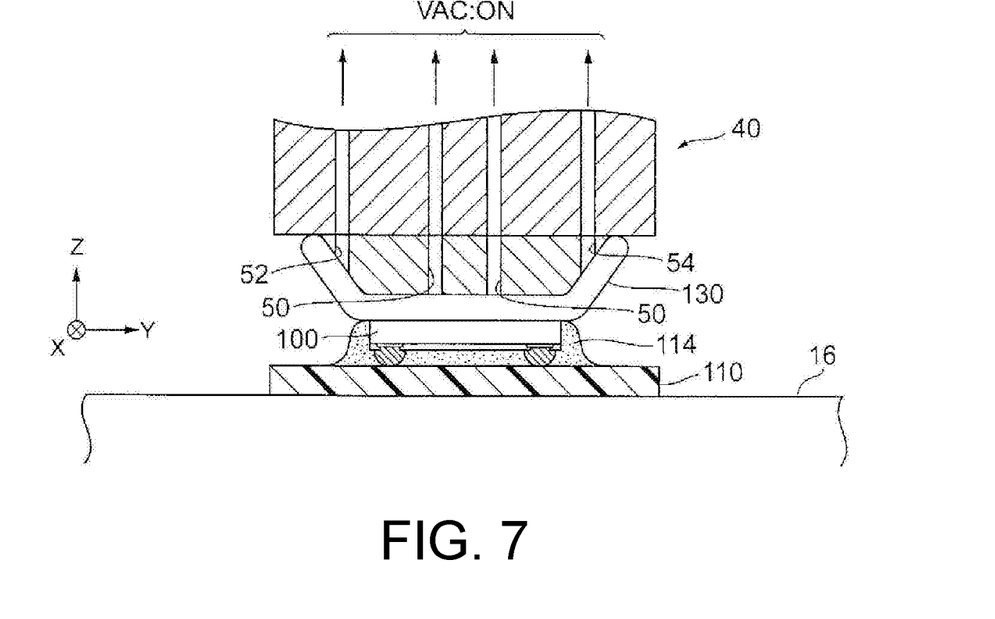
FIG. 7 is a view illustrating the bonding method according to the first embodiment.

Thereafter, as illustrated in FIG. 7, the bonding tool 40 is lowered toward the bonding stage 16, pressurizing and heating are performed by the bonding tool 40, and then the semiconductor die 100 is bonded to the substrate 110 with the thermally cured adhesive material 114 therebetween. In this way, electrical connection between the bump electrode 106 of the semiconductor die 100 and a wiring (not illustrated) of the substrate 110 can be achieved, and at the same time, resin sealing between the semiconductor die 100 and the substrate 110 can be performed. Further, the adhesive material is not limited to the mode in which the adhesive material is provided on the substrate 110 in advance before the bonding, and a space between the semiconductor die 100 and the substrate 110 may be filled as an underfill during the bonding process.

After the thermo-compression bonding of the semiconductor die 100 to the substrate 110 is completed, the semiconductor die 100 is separated from the bonding surface 44 (S14). Specifically, as illustrated in FIG. 8, while the suction operation of the first suction holes 50 is controlled such that it is in an OFF state (VAC: OFF), the suction operations of the second suction holes 52 and 54 are both controlled such that they are in ON states (VAC: ON). In this way, only the semiconductor die 100 can be separated from the bonding distal end portion 42 while the porous sheet 130 is adsorbed to the bonding distal end portion 42. In this case, since the porous sheet 130 is adsorbed to the pair of tapered side surfaces 46a and 46c facing each other, the porous sheet 130 can remain and be stably adsorbed to the bonding distal end portion 42.

Thereafter, the bonding tool 40 is moved above the sheet placement stage 17, and the porous sheet 130 is separated from the bonding surface 44 onto the sheet placement portion 60 (S15). Specifically, as illustrated in FIG. 9, all the suction operations of the first suction holes 50 and the second suction holes 52 and 54 are caused to be in OFF states. In this way, the porous sheet 130 can be separated from the bonding distal end portion 42. Thereafter, the used porous sheet 130 disposed on the sheet placement portion 60 is collected into the sheet collection hole 62 by causing a suction operation of the sheet collection hole 62 to be in an ON state (VAC: ON).

Further, in the bonding method described above, instead of causing the suction operation to be in the OFF state, an exhaust operation may be controlled such that it is in an ON state to cause vacuum breakage by air blowing or the like. According to this, the semiconductor die 100 or the porous sheet 130 can be reliably separated from the bonding tool 40.

As described above, the bonding apparatus according to the present embodiment is a bonding apparatus in which an electronic component is thermo-compression bonded to a substrate or other electronic components with an adhesive material therebetween, and includes a bonding tool having a bonding distal end portion which includes a bonding surface having first suction holes that adsorb the electronic component with an individual piece-like porous sheet sandwiched therebetween, and a tapered side surface formed in a tapered shape tapering toward the bonding surface and having second suction holes that adsorb the porous sheet, and a bonding control unit which controls the first suction holes and the second suction holes independently of each other.

According to the above-described configuration, since the bonding control unit which controls the first suction holes provided on the bonding surface and the second suction holes provided on the tapered side surface independently of each other is provided, adsorption or separation of the electronic component or the porous sheet can be each controlled independently as necessary. Therefore, the electronic component can be satisfactorily bonded on the substrate with the adhesive material therebetween. Also, since the porous sheet is adsorbed by the second suction holes provided on the tapered side surface, end portions of the individual piece-like porous sheet are prevented from sagging, and the porous sheet can be reliably adsorbed to the bonding distal end portion during the bonding process. Also, since a portion in which the second suction holes are provided is formed in a tapered shape, a bonding process corresponding to narrowing of the pitch can be performed.

In the above-described aspect, the bonding surface may have a rectangular shape, and the tapered side surface may be provided on at least respective sides of the bonding surface facing each other.

In the above-described aspect, the bonding surface may be larger than the electronic component in a plan view of the bonding surface.

In the above-described aspect, in order to supply or collect the porous sheet with respect to the bonding tool, at least one sheet placement portion on which the porous sheet is placed may be further provided.

In the above-described aspect, the at least one sheet placement portion may include a bottom surface that supports the porous sheet, and a tapered side surface formed in a tapered shape which widens with distance away from the bottom surface.

In the above-described aspect, the bottom surface of the sheet placement portion may be rectangular, and the tapered side surface of the sheet placement portion may be provided on at least respective sides of the bottom surface facing each other.

In the above-described aspect, a sheet collection hole for collecting the porous sheet may be provided on the bottom surface of the sheet placement portion.

A bonding method according to the present embodiment includes a process of preparing a bonding tool having a bonding distal end portion which includes a bonding surface having first suction holes that adsorb an electronic component with an individual piece-like porous sheet sandwiched therebetween, and a tapered side surface formed in a tapered shape tapering toward the bonding surface and having second suction holes that adsorb the porous sheet, a process of adsorbing the electronic component to the bonding surface with the porous sheet sandwiched therebetween by causing suction operations of the first suction holes and the second suction holes to be in ON states, a process of performing thermo-compression bonding of the electronic component to a substrate or other electronic components with an adhesive material therebetween using the bonding tool, and a process of separating the electronic component from the bonding surface by causing the suction operation of the first suction holes to be in an OFF state or an exhaust operation to be in an ON state while causing the suction operation of the second suction holes to be in an ON state.

According to the above-described configuration, since the bonding control unit which controls the first suction holes provided on the bonding surface and the second suction holes provided on the tapered side surface independently of each other is provided, adsorption or separation of the electronic component or the porous sheet can be each controlled independently as necessary. Therefore, the electronic component can be satisfactorily bonded on the substrate with the adhesive material therebetween. Also, since the porous sheet is adsorbed by the second suction holes provided on the tapered side surface, end portions of the individual piece-like porous sheet are prevented from sagging, and the porous sheet can be reliably adsorbed to the bonding distal end portion during the bonding process. Also, since a portion in which the second suction holes are provided is formed in a tapered shape, a bonding process corresponding to narrowing of the pitch can be performed.

Also, since the porous sheet is interposed between the bonding distal end portion and the electronic component, even when the adhesive material creeps up from a side surface of the electronic component, adhesion of the adhesive material to the bonding distal end portion can be prevented. Therefore, even when a bonding surface larger than the electronic component is applied in the XY plan view, contamination of the bonding tool is suppressed, and maintainability of the device does not deteriorate. Therefore, the whole of the electronic component can be uniformly pressed and maintainability can be enhanced.

Also, since a porous sheet is used, a fume gas generated when the electronic component or the adhesive material is heated is suppressed from adhering to the bonding distal end portion or entering the first suction holes and the second suction holes. Therefore, contamination of the bonding tool can be suppressed also in this point, and the maintainability can be further enhanced.

The present invention is not limited to the above-described embodiment and various modifications can be made and applied.

In the above-described embodiment, although an aspect in which the tapered side surface 46 of the bonding distal end portion 42 is provided on each side of the bonding surface 44 has been described, it is not necessary to provide the tapered side surface 46 on all the sides, and the tapered side surface may be provided on only two sides facing each other. In this case, one or more second suction holes may be provided on each of the tapered side surfaces on the two sides facing each other.

In the above-described embodiment, although an aspect in which the second suction holes 52 and 54 are provided on the two tapered side surfaces 46a and 46c facing each other among the tapered side surfaces 46a to 46d has been described, the second suction holes may be provided also on the other two tapered side surfaces 46b and 46d facing each other in addition to the above-described aspect.

In the above-described embodiment, although an aspect in which a plurality of first suction holes 50 and a plurality of second suction holes 52 and 54 are provided has been described, one suction hole may be provided for each of the bonding surface 44, the tapered side surface 46a, and the tapered side surface 46c.

In the above-described embodiment, although an aspect in which the sheet placement stage 17 is concurrently used for supplying and collecting the porous sheet 130 has been described, it may be divided into a stage for supplying the porous sheet 130 and a stage for collecting it. In that case, a configuration of the sheet placement portion of the respective stages may be the same as each other.

In the above-described embodiment, although an aspect of face-down bonding of the semiconductor die 100 has been described as an example, the present invention may be applied to a face-up bonding. In this case, the semiconductor die 100 is bonded to the substrate 110 such that the second main surface 102b of the semiconductor die 100 faces the substrate 110.

Also, in the above-described embodiment, although an aspect in which the electrode pad 104 and the bump electrode 106 are provided on the first main surface 102a has been described as an example of the semiconductor die 100 to be bonded, a semiconductor die having a through electrode penetrating both the main surfaces may be bonded to the substrate 110. In this case, semiconductor dies may be stacked over a plurality of stages in a mounting region of the substrate 110, and the plurality of semiconductor dies may be collectively bonded for each stage.

Also, an example of electronic components to be bonded is not limited to the semiconductor die, and a semiconductor device in which a semiconductor die is packaged may be bonded to the substrate. Alternatively, the electronic component may be either an active element or a passive element or may be other components.

Second Embodiment

In the first embodiment, a semiconductor die is bonded to the substrate 110 with a porous sheet having air permeability sandwiched between the bonding tool and the semiconductor die, but the present embodiment is different from the first embodiment in that air-permeable pores are formed in a sheet having no air permeability to give the sheet air permeability. Hereinafter, differences from the first embodiment will be mainly described.

Figure 11:
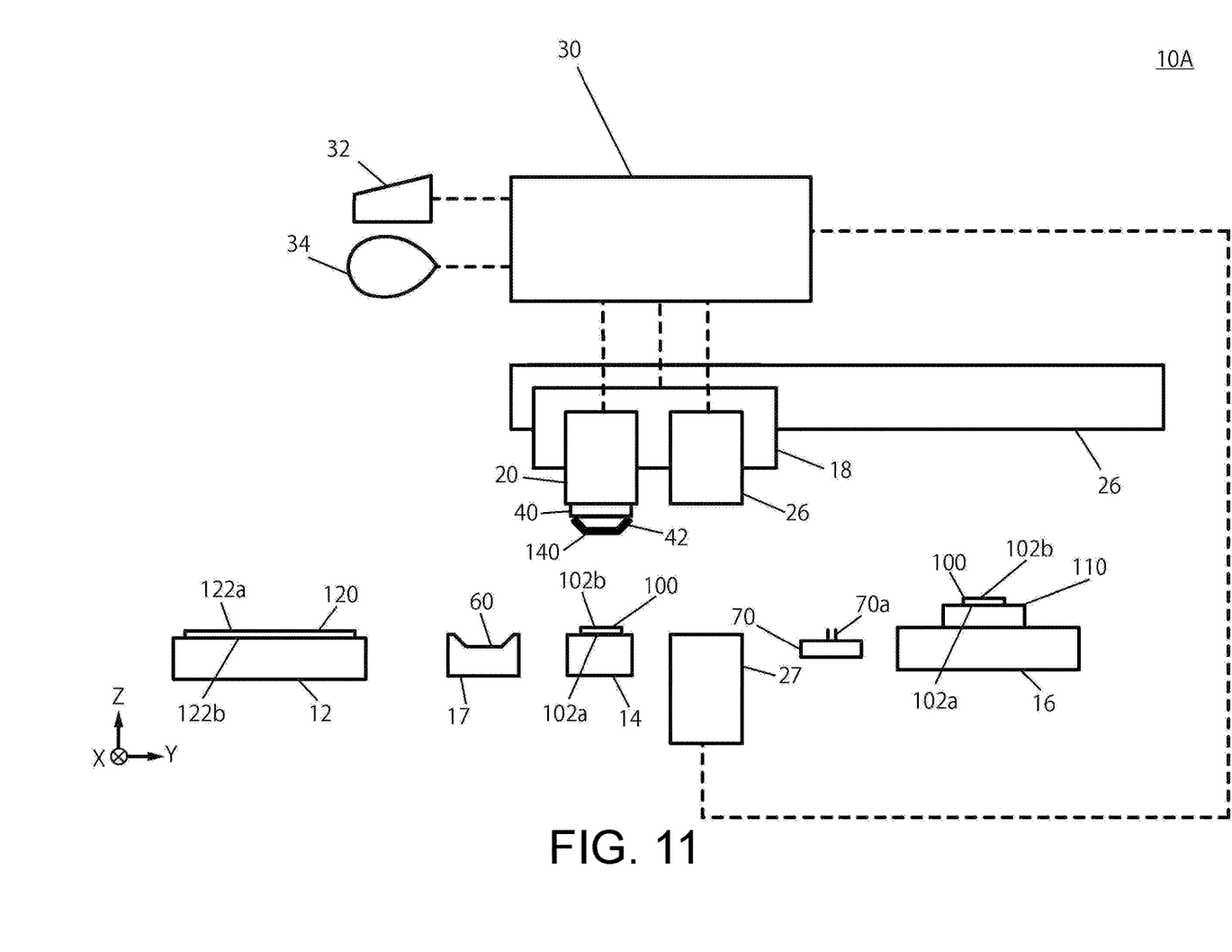
FIG. 11 is a view illustrating a bonding apparatus according to a second embodiment of the present invention.

FIG. 11 is a view illustrating a bonding apparatus according to a second embodiment of the present invention. A bonding apparatus 10A of the present embodiment illustrated in FIG. 11 includes a perforating mechanism 70. The perforating mechanism 70 forms air-permeable pores in a sheet 140 for preventing creeping-up that is held by a bonding distal end portion 42. The sheet 140 is a resin sheet having no air permeability, for example, such as polypropylene, polyester, vinyl chloride, or polyimide, but the material can be used without being limited thereto.

The perforating mechanism 70 is provided in a range in which a bonding head 18 is movable in X and Y directions. The perforating mechanism 70 includes a plurality of needle members 70a for forming air-permeable pores in the sheet 140 corresponding to the first suction holes 50 illustrated in FIG. 3. The needle members 70a moves up and down in a Z direction using a drive mechanism (not illustrated) together with the perforating mechanism 70 and penetrate through the sheet 140 held by a bonding tool 40 that is stopped immediately above the perforating mechanism 70, thereby forming air-permeable pores in the sheet 140.

Here, second suction holes 52 formed at the bonding distal end portion 42 are provided to suppress wrinkling or sagging of the sheet 140 held by the bonding tool 40. Therefore, a semiconductor die 100 can be adsorbed and held by the bonding tool 40 without forming the air-permeable pores at portions corresponding to the second suction holes 52 and 54 of the sheet 140 using the perforating mechanism 70. Further, as long as the wrinkling and sagging of the sheet 140 can be suppressed, the air-permeable pores corresponding to the second suction holes 52 may be formed as a matter of course.

Also, the perforating mechanism 70 may be configured to be fixed and disposed to the bonding apparatus 10A without having a drive mechanism. In this configuration, the bonding tool 40 moves up and down with respect to the perforating mechanism 70 to form the air-permeable pores in the sheet 140.

Further, each of the air-permeable pores need not be formed in the sheet 140 corresponding to one first suction hole 50, and one or a plurality of air-permeable pores may be formed corresponding to the first suction hole 50. In this configuration, a hole having a diameter larger than a diameter of the needle member 70a may be formed in the bonding distal end portion 42, and air-permeable pores corresponding to the hole may be formed in the sheet 140. Also, a groove communicating with the bonding distal end portion 42 may be formed and the needle member 70a may be formed into a hollow shape corresponding to the groove, and thereby an open hole having a shape corresponding to the groove and the hollow shape may be formed in the sheet 140.

According to the present embodiment, also in a configuration in which the sheet 140 having no air permeability is employed in to suppress the creeping-up, wrinkling and sagging of the sheet 140 held by the bonding tool 40 can be effectively suppressed.

Third Embodiment

Although the perforating mechanism 70 according to the second embodiment forms the air-permeable pores in the sheet 140 in a state in which the sheet 140 is held by the bonding tool 40, a perforating mechanism 71 of the present embodiment is different in that the perforating mechanism 71 forms air-permeable pores in a sheet 140 in a state in which the sheet 140 is placed on a sheet placement stage 17. Differences from the second embodiment will be mainly described below.

Figure 12:
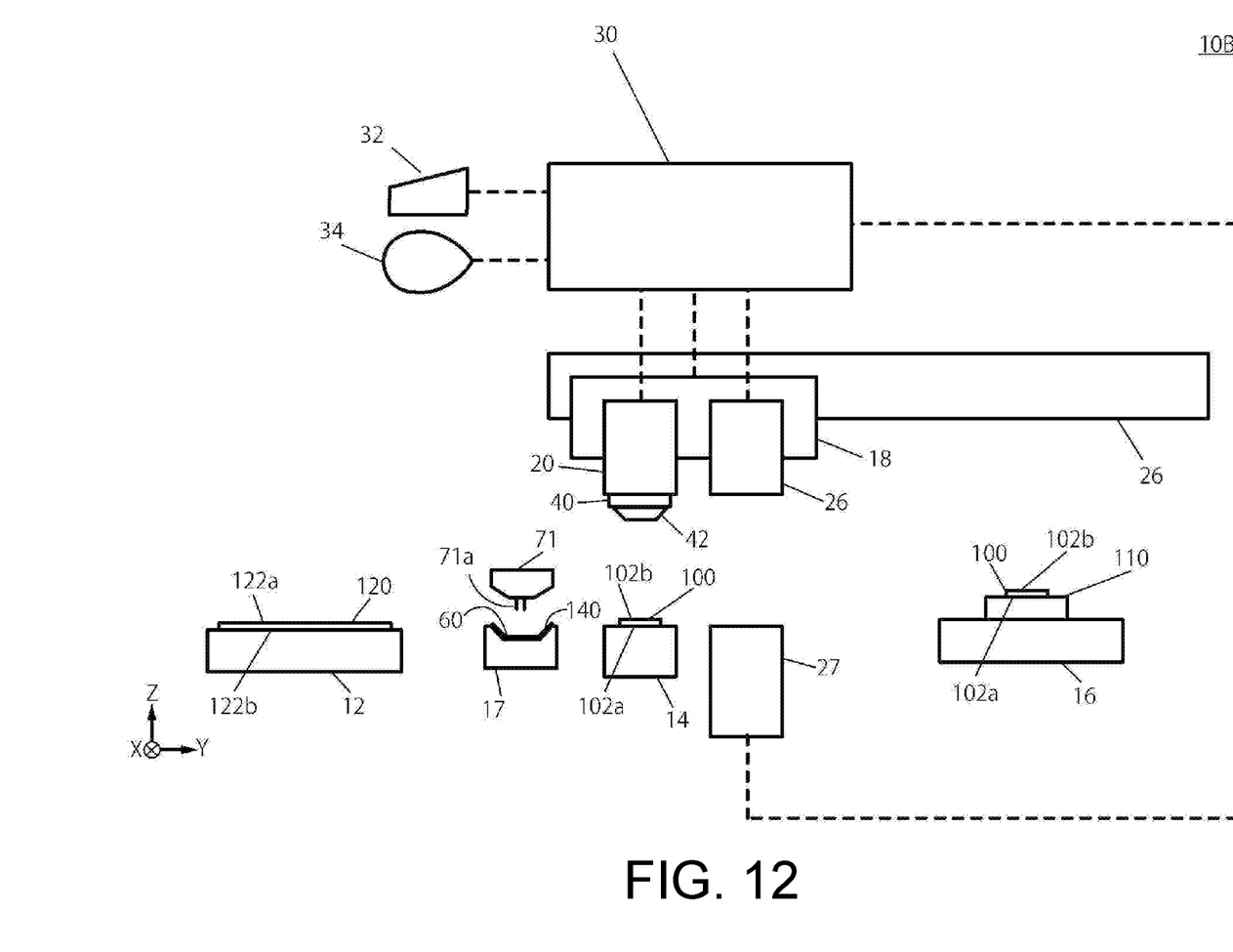
FIG. 12 is a view illustrating a bonding apparatus according to a third embodiment of the present invention.

FIG. 12 is a view illustrating a bonding apparatus according to a third embodiment of the present invention. A bonding apparatus 10B of the present embodiment illustrated in FIG. 12 includes a perforating mechanism 71 having a plurality of needle members 71a. Holes (not illustrated) corresponding to the plurality of needle members 71a are formed in the sheet placement stage 17. The perforating mechanism 71 moves up and down in a Z direction with respect to the sheet placement stage 17 using a drive mechanism (not illustrated) and the needle members 71a are caused to penetrate through the sheet 140, thereby forming air-permeable pores. Further, the perforating mechanism 71 may be fixed to the bonding apparatus, and the sheet placement stage 17 may be driven with respect to the perforating mechanism 71 to form air-permeable pores in the sheet 140.

The bonding tool 40 adsorbs and holds the sheet 140 in which the air-permeable pores are formed, and then bonds the semiconductor die 100 to the substrate 110 with the sheet 140 therebetween.

Further, the bonding apparatus may have an aspect in which the sheet 140 is cut out into individual pieces and air-permeable pores are formed by a segmentation mechanism (not illustrated) for dividing the sheet 140 into individual pieces. Also, a separate mechanism for forming air-permeable pores in the sheet 140 may be provided.

Also, a sheet in which a plurality of air-permeable pores for imparting air permeability to a sheet formed of a material having no air permeability are formed regularly or irregularly in advance may be used as a sheet of preventing creeping-up.

Also, although it has been described that a plurality of first suction holes 50 are provided in a central region of the bonding surface 44, the plurality of first suction holes 50 may be provided regularly or irregularly, for example, in the vicinity of edge portions of the bonding surface 44 or in the entire bonding surface 44.

Also, the first suction holes 50 and the second suction holes 52 may be a polygonal hole such as a rectangle or an elongated hole. Further, the first suction holes 50 and the second suction holes 52 may have a groove shape provided to communicate with the bonding surface 44.

Also, instead of the tapered side surfaces 46a to 46d of the bonding tool 40, the tapered side surface may be provided only on two surfaces facing each other. Similarly, instead of the tapered side surfaces 66a to 66d of the sheet placement portion 60, the tapered side surface may be provided only on two surfaces facing each other.

Implementation aspects described through the embodiments of the above-described invention can be used in combination or with modifications or improvements as appropriate depending on applications, and the present invention is not limited to the description of the embodiments described above. It is apparent from the description of the scope of the claims that embodiments with such combinations, modifications, or improvements can also be included in the technical scope of the present invention.

What is claimed is:

1. A bonding apparatus which thermo-compression bonds an electronic component to a substrate or other electronic component with an adhesive material therebetween, the bonding apparatus comprising:
a bonding tool having a bonding distal end portion including:
a bonding surface having a first suction hole that adsorbs the electronic component with an individual piece-like air-permeable sheet having air permeability sandwiched therebetween; and
a tapered side surface formed in a tapered shape tapering toward the bonding surface and having a second suction hole that adsorbs the air-permeable sheet; and
a bonding control unit which controls the first suction hole and the second suction hole independently of each other.

2. The bonding apparatus according to claim 1, wherein the bonding surface has a rectangular shape, and
the tapered side surface is provided on at least respective sides of the bonding surface facing each other.

3. The bonding apparatus according to claim 1, wherein the bonding surface is larger than the electronic component in a plan view of the bonding surface.

4. The bonding apparatus according to claim 1, further comprising at least one sheet placement portion on which the air-permeable sheet is placed to supply or collect the air-permeable sheet with respect to the bonding tool.

5. The bonding apparatus according to claim 4, wherein the at least one sheet placement portion includes:
a bottom surface which supports the air-permeable sheet, and
a tapered side surface formed in a tapered shape which widens with distance away from the bottom surface.

6. The bonding apparatus according to claim 5, wherein the bottom surface of the sheet placement portion has a rectangular shape, and
the tapered side surface of the sheet placement portion is provided on at least respective sides of the bottom surface facing each other.

7. The bonding apparatus according to claim 5, wherein a sheet collection hole which collects the air-permeable sheet is provided on the bottom surface of the sheet placement portion.

8. The bonding apparatus according to claim 1, wherein the air-permeable sheet has air permeability due to air-permeable pores formed in a sheet having no air permeability, and
the bonding apparatus further comprises a perforating mechanism which is configured to form air-permeable pores in the sheet having no air permeability.

9. The bonding apparatus according to claim 1, wherein the air-permeable sheet is a porous sheet.

10. A bonding method comprising:
a process of preparing a bonding tool having a bonding distal end portion including:
a bonding surface having a first suction hole that adsorbs an electronic component with an individual piece-like air-permeable sheet having air permeability sandwiched therebetween; and
a tapered side surface formed in a tapered shape tapering toward the bonding surface and having a second suction hole that adsorbs the air-permeable sheet;
a process of adsorbing the electronic component to the bonding surface with the air-permeable sheet sandwiched therebetween by causing suction operations of the first suction hole and the second suction hole to be in ON states;
a process of thermo-compression bonding the electronic component to a substrate or other electronic component with an adhesive material therebetween using the bonding tool; and
a process of separating the electronic component from the bonding surface by causing the suction operation of the first suction hole to be in an OFF state or an exhaust operation to be in an ON state while causing the suction operation of the second suction hole to be in an ON state.

11. The bonding method according to claim 10, further comprising:
a process of preparing at least one sheet placement portion on which the air-permeable sheet is placed, wherein the at least one sheet placement portion includes:
a bottom surface which supports the air-permeable sheet; and
a tapered side surface formed in a tapered shape which widens with distance away from the bottom surface.

12. The bonding method according to claim 10, wherein the air-permeable sheet has air permeability due to air-permeable pores formed in a sheet having no air permeability, and
the bonding method further comprises a process of forming air-permeable pores in the sheet having no air permeability using a perforating mechanism.

13. The bonding method according to claim 10, wherein the air-permeable sheet is a porous sheet.

14. The bonding apparatus according to claim 2, wherein the bonding surface is larger than the electronic component in a plan view of the bonding surface.

15. The bonding apparatus according to claim 2, further comprising at least one sheet placement portion on which the air-permeable sheet is placed to supply or collect the air-permeable sheet with respect to the bonding tool.

16. The bonding apparatus according to claim 3, further comprising at least one sheet placement portion on which the air-permeable sheet is placed to supply or collect the air-permeable sheet with respect to the bonding tool.

17. The bonding apparatus according to claim 6, wherein a sheet collection hole which collects the air-permeable sheet is provided on the bottom surface of the sheet placement portion.

18. The bonding apparatus according to claim 2, wherein the air-permeable sheet has air permeability due to air-permeable pores formed in a sheet having no air permeability, and
the bonding apparatus further comprises a perforating mechanism which is configured to form air-permeable pores in the sheet having no air permeability.

19. The bonding method according to claim 11, wherein the air-permeable sheet has air permeability due to air-permeable pores formed in a sheet having no air permeability, and
the bonding method further comprises a process of forming air-permeable pores in the sheet having no air permeability using a perforating mechanism.

20. The bonding method according to claim 11, wherein the air-permeable sheet is a porous sheet.

* * * * *